(12) United States Patent
Liu et al.

(10) Patent No.: US 8,053,960 B2
(45) Date of Patent: Nov. 8, 2011

(54) LED ILLUMINATION DEVICE

(75) Inventors: Tay-Jian Liu, Taipei Hsien (TW);
Yeu-Lih Lin, Taipei Hsien (TW);
Yi-Chyng Fang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 322 days.

(21) Appl. No.: 12/406,095

(22) Filed: Mar. 17, 2009

(65) Prior Publication Data
US 2009/0261707 A1 Oct. 22, 2009

(30) Foreign Application Priority Data

Apr. 18, 2008 (CN) .......................... 2008 1 0066829

(51) Int. Cl.
*F21V 29/00* (2006.01)
(52) U.S. Cl. ........................ 313/46; 362/294; 362/373
(58) Field of Classification Search ........................ None
See application file for complete search history.

(56) References Cited

U.S. PATENT DOCUMENTS

| | | | | |
|---|---|---|---|---|
| 6,910,794 B2 * | 6/2005 | Rice | | 362/373 |
| 7,575,346 B1 * | 8/2009 | Horng et al. | | 362/373 |
| 7,607,802 B2 * | 10/2009 | Kang et al. | | 362/294 |
| 7,699,501 B2 * | 4/2010 | Liu | | 362/294 |
| 7,717,590 B1 * | 5/2010 | Li | | 362/294 |
| 7,726,544 B2 * | 6/2010 | Fang et al. | | 228/180.22 |
| 7,766,512 B2 * | 8/2010 | Chou et al. | | 362/294 |
| 7,771,082 B2 * | 8/2010 | Peng et al. | | 362/249.02 |
| 7,800,119 B2 * | 9/2010 | He et al. | | 257/79 |
| 2005/0174780 A1 * | 8/2005 | Park | | 362/294 |
| 2006/0232974 A1 * | 10/2006 | Lee et al. | | 362/294 |
| 2008/0043472 A1 * | 2/2008 | Wang | | 362/294 |
| 2009/0268468 A1 * | 10/2009 | Liu | | 362/294 |
| 2009/0290353 A1 * | 11/2009 | Chou | | 362/294 |
| 2010/0060130 A1 * | 3/2010 | Li | | 313/46 |

FOREIGN PATENT DOCUMENTS

CN 101118052 A 2/2008
CN 201041334 Y 3/2008

* cited by examiner

*Primary Examiner* — Ashok Patel
(74) *Attorney, Agent, or Firm* — Altis Law Group, Inc.

(57) ABSTRACT

An LED illumination device includes an optical section disposed at a bottom end of the LED illumination device, and in which a light source is provided. A heat dissipation section located adjacent to the optical section includes a plurality of fins thermally contacting the light source. The electrical section is disposed at a top end of the LED illumination device and electrically connects with the light source. The heat dissipation section is disposed between the optical section and the electrical section. The electrical section defines a plurality of air exchanges communicating the inside of the electrical section with the heat dissipation section and a plurality of exhaust ports communicating the inside of the electrical section with an external environment of the LED illumination device.

15 Claims, 4 Drawing Sheets

LED ILLUMINATION DEVICE

BACKGROUND

1. Technical Field

The disclosure generally relates to light emitting diode (LED) illumination devices, and particularly to an LED illumination device with highly efficient heat dissipation.

2. Description of Related Art

LEDs (light emitting diodes) are often preferred for use in illumination devices rather than CCFLs (cold cathode fluorescent lamps) due to their high brightness, long lifespan, and a wide color range.

For an LED, 80 to 90% of the power consumed by the LED is expended as thermal energy, with only the remaining 10 to 20% of the power consumed providing visible light. In addition, a plurality of LEDs are generally packaged in a single LED illumination device to obtain desired brightness.

Accordingly, high brightness LED illumination devices require highly efficient heat dissipation for timely and adequate removal of the heat generated to avoid impaired performance and even device failure. Frequently used heat dissipation devices such as heat sinks, fans, and combinations thereof may be unable to provide sufficient heat dissipation for the high brightness LED illumination device, in addition to frequently consuming unacceptable levels of energy.

DETAILED DESCRIPTION OF THE EMBODIMENTS

Figure 1:
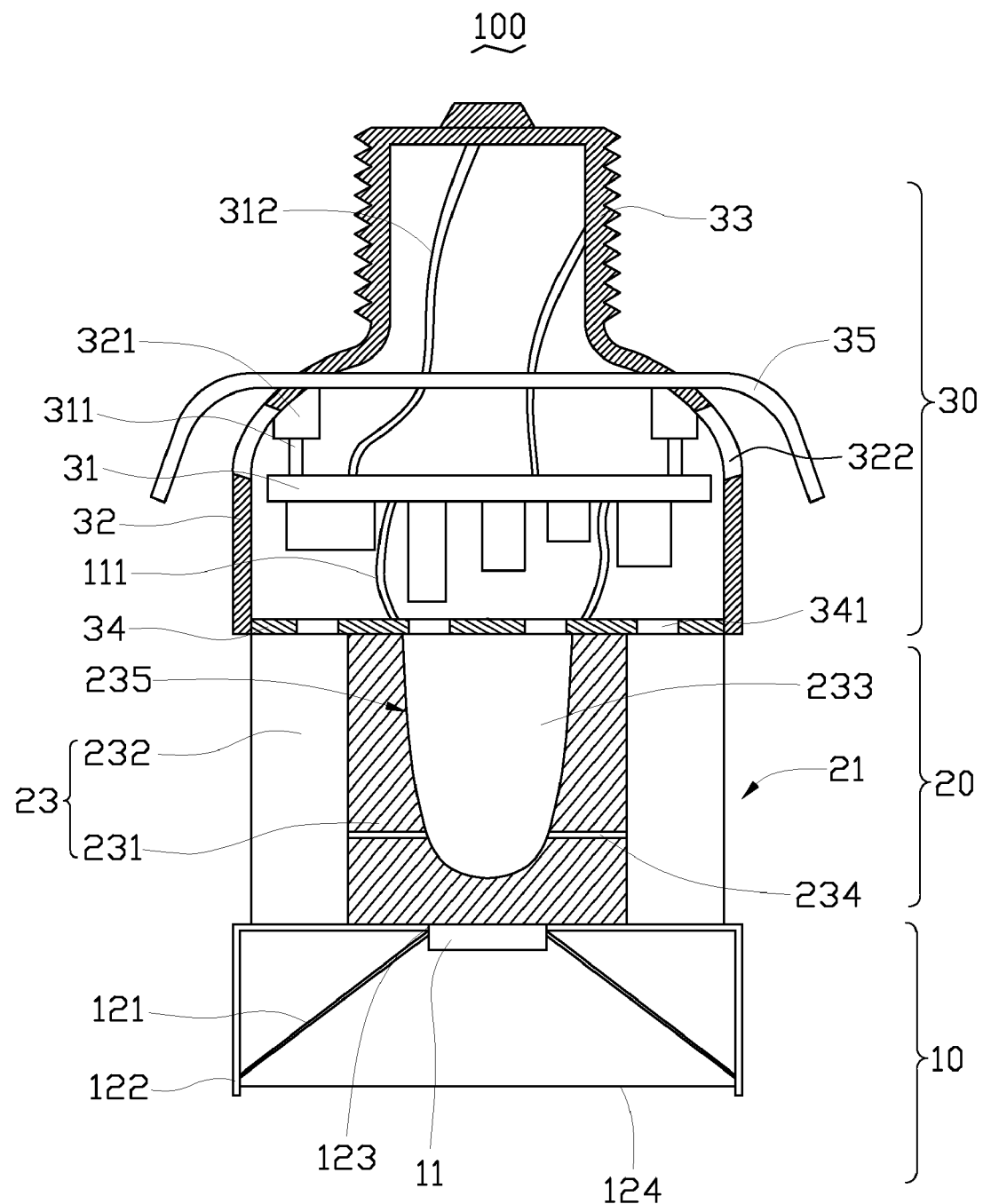
FIG. 1 is a cross-section of an LED illumination device in accordance with a first embodiment of the disclosure.

Reference will now be made to the drawing figures to describe the various embodiments in detail.

FIG. 1 is a cross-section of an LED illumination device 100 in accordance with a first embodiment of the disclosure. The LED illumination device 100 includes an optical section 10, an electrical section 30, and a heat dissipation section 20 therebetween. The LED illumination device 100 is substantially cylindrical. The optical section 10 is disposed at a bottom end of the LED illumination device 100 and the electrical section 30 is disposed at a top end thereof.

The optical section 10 includes a housing 122, a light reflector 121, a light source 11, and an optical lens 124. A top end of the housing 122 is coupled to the heat dissipation section 20, and a bottom end of the housing 122 is sealed by the optical lens 124. The light reflector 121 and the light source 11 are received in the housing 122. The housing 122 provides protection for the light source 11 and the light reflector 121. In this embodiment, the light source 11 includes a plurality of light emitting diodes (LEDs). The light reflector 121 is conical, tapering from a bottom end to a top end thereof. The top end of the light reflector 121, adjacent to the heat dissipation section 20, defines an opening 123 receiving the light source 11, and the bottom end of the light reflector 121 is received on the bottom end of the housing 122. The light reflector 121 and the optical lens 124 provide luminescence for the light source 11.

The electrical section 30 provides power, control circuitry, and power management for the light source 11, and includes a casing 32, a lamp head 33, a mounting plate 34, a circuit board 31 and a dustproof cover 35. A bottom end of the casing 32 is attached to the heat dissipation section 20, and a top end thereof receives the lamp head 33. The mounting plate 34 is mounted at the bottom end of the casing 32 between the electrical section 30 and the heat dissipation section 20. A plurality of air exchanges 341 is defined in the mounting plate 34, communicating the electrical section 30 with the heat dissipation section 20. A plurality of exhaust ports 322 is defined in the casing 32 adjacent to the lamp head 33 of the casing 32. The exhaust ports 322 communicate an interior of the electrical section 30 with an external environment of the LED illumination device 100 and dissipate heat from the circuit board 31. The circuit board 31 is mounted in the casing 32 of the electrical section 30 through a mounting mechanism which includes a socket 321 and a connecting post 311. The socket 321 is attached to an inner surface of the casing 32. The connecting post 311 connects the circuit board 31 with the socket 321. The dustproof cover 35 covers an outer side of the exhaust ports 322 of the casing 32, preventing entry of airborne contaminants into the interior.

The electrical section 30 is further provided with a plurality of electrical wires 312, 111 connected with the circuit board 31. The electrical wires 111 extend through the mounting plate 34 and electrically connect the lamp head 33 with the light source 11, providing operating power thereto.

The heat dissipation section 20 is provided with a heat sink 23, including a columnar metal base 231 and a plurality of metal fins 232 extending radially and outwardly from an outer circumferential surface of the metal base 231. The metal base 231 has a top surface contacting the mounting plate 34 of the electrical section 30 and a bottom surface contacting the light source 11. A blind hole 233 is defined at an upper portion of the metal base 231 to increase the heat exchange surface of the heat sink 23. The blind hole 233 communicates with the electrical section 30 via the air exchanges 341, and extends vertically and inwardly from the top surface of the metal base 231. The blind hole 233 gradually decreases in size from the top surface of the metal base 231 towards the bottom surface of the metal base 231, which has a smooth, curved inner surface 235. A plurality of air venting channels 234 is radially defined in a lower portion of the metal base 231. Each of the air venting channels 234 communicates a bottom of the blind hole 233 with an external environment of the metal base 231. The heat sink 23 is preferably aluminum or aluminum alloy manufactured via extrusion.

The light source 11 and the top end of the light reflector 121 are mounted on the bottom surface of the metal base 231 of the heat sink 23. The heat dissipation section 20 and the light source 11 cooperatively form a light engine 21 for the LED illumination device 100. During operation of the LED illumination device 100, heat generated by the light source 11 is conducted to the heat sink 23 via the metal base 231 directly, whereby air in the heat dissipation section 20, that is, in the spaces formed between each two neighboring metal fins 232 and the blind hole 233, is heated by the transferred heat of the light source 11 and rises accordingly, exiting to the electrical section 30 via the air exchanges 341 of the mounting plate 34, and further to ambient atmosphere via the exhaust ports 322 of the casing 32. Simultaneously, cool air in the ambient atmosphere is drawn into the spaces between each two neighboring metal fins 232, and enters the blind hole 233 via the air venting channels 234 by the resulting air pressure differential. The resulting convection circulating through the heat dissipation section 20 rapidly dissipates heat generated from the light source 11 into the ambient environment.

Figure 2:
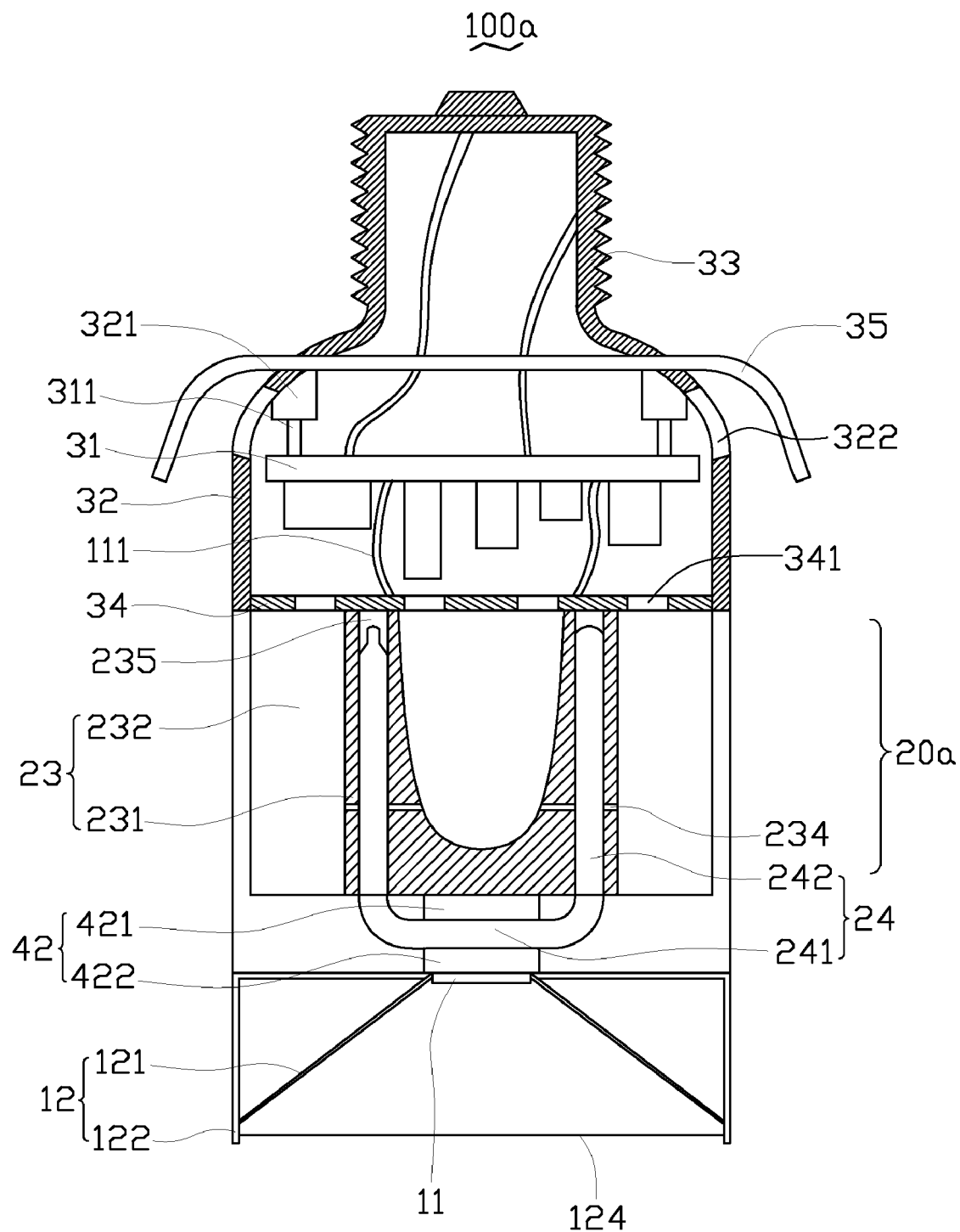
FIG. 2 is a cross-section of an LED illumination device in accordance with a second embodiment of the disclosure.

FIG. 2 is a cross-section of an LED illumination device 100a in accordance with a second embodiment of the disclosure, differing from the previous embodiment only in that a heat dissipation section 20a further includes a mounting seat 42, a U-shaped heat pipe 24, and two through holes 235 provided in the metal base 231 of the heat sink 23. Each of the through holes 235 extends from the top surface of the metal base 23 to the bottom surface of the metal base 23. The heat pipe 24 includes an evaporating portion 241 and two condensing sections 242 extending upwardly and perpendicularly from two opposite ends thereof. The condensing sections 242 of the heat pipe 24 are thermally received in the through holes 235 of the metal base 23.

The mounting seat 42 interconnects the metal base 231 with the light source 11. The mounting seat 42 includes a top mounting block 421 and a bottom mounting block 422. A top surface of the top mounting block 421 is directly attached to the bottom surface of the metal base 231, whereby the top mounting block 421 can directly transfer heat to the metal base 231. A bottom surface of the top mounting block 421 is provided with a semi-circular groove (not labeled). A top surface of the bottom mounting block 422 is provided with a semi-circular groove (not labeled) corresponding to the semi-circular groove of the top mounting block 421. When the top and the bottom mounting blocks 421, 422 are mounted together, the semi-circular grooves cooperatively form a circular groove receiving the evaporating section 241 of the heat pipe 24 therein. Alternatively, the top mounting block 421 and the bottom mounting block 422 can be integrally formed as a single metal block with a circular groove defined therethrough receiving the evaporating section 241 of the heat pipe 24. In this case, the heat pipe 24 is originally straight, and then bent to have the U-shaped configuration after the straight heat pipe is inserted into the circular groove.

In the present LED illumination device 100a, the heat pipe 24 effectively removes heat generated by the light source 11. The heat of the light source 11 is initially transferred to the bottom mounting block 422. A portion of the heat transferred to the bottom mounting block 422 is thereafter transferred to the top mounting block 421, and then to the metal base 231 via the top mounting block 421. Another portion of the heat transferred to the bottom mounting block 422 is thereafter rapidly transferred to the evaporating portion 241 of the heat pipe 24, and then to the metal base 231 via the heat pipe 24. The heat is finally and effectively dissipated by the heat dissipation section 20a via the natural air convection circulated therethrough.

Figure 3:
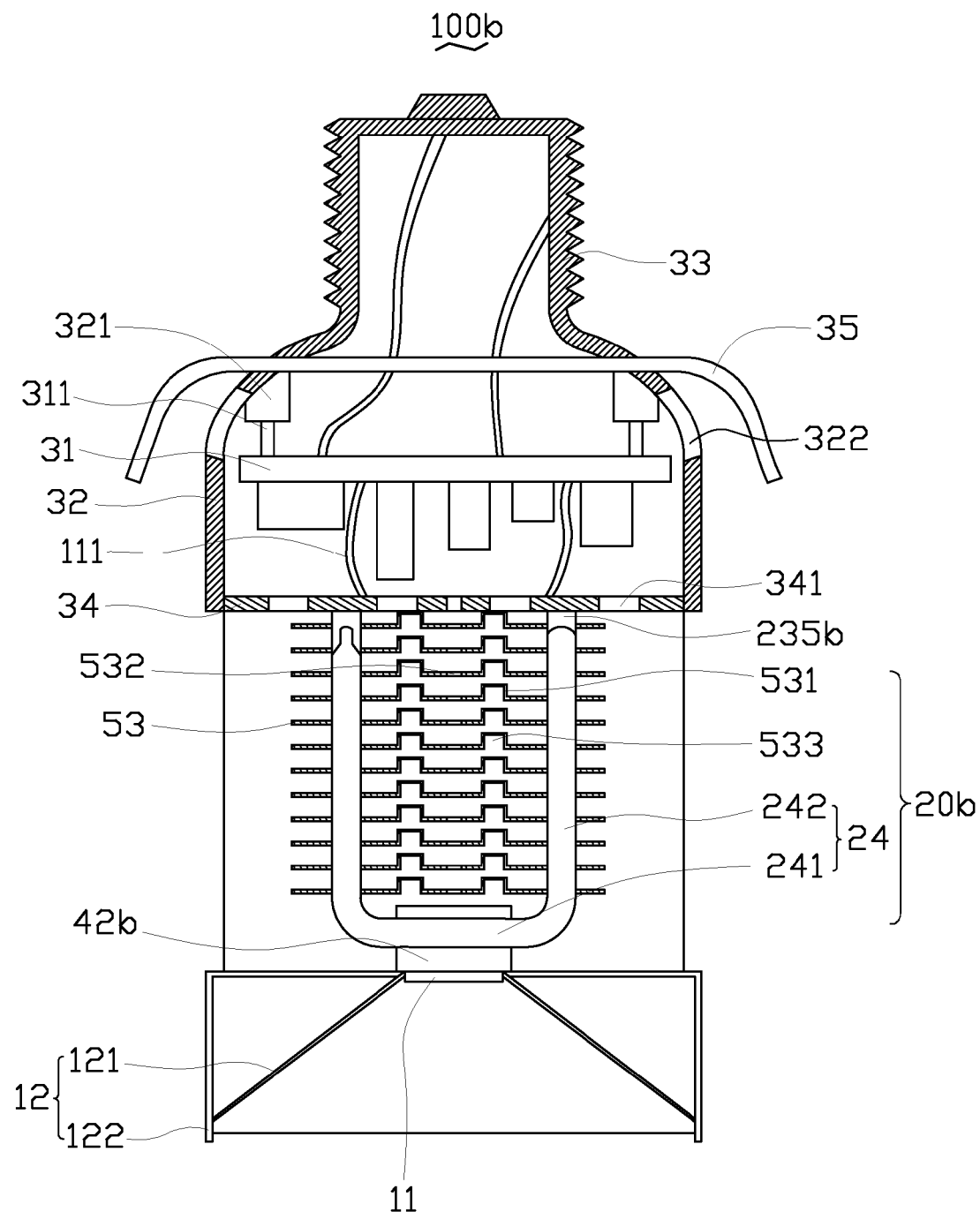
FIG. 3 is a cross-section of an LED illumination device in accordance with a third embodiment of the disclosure.

FIG. 3 is a cross-section of an LED illumination device 100b in accordance with a third embodiment of the disclosure, differing from the previous embodiment only in that a heat dissipation section 20b includes a mounting seat 42b, a plurality of parallel, stacked fins 53 arranged on the top surface of the mounting seat 42b, and two U-shaped heat pipes 24 (only one heat pipe 24 is visible in FIG. 3). Each of the heat pipes 24 includes an evaporating section 241 and two condensing sections 242 extending upwardly and perpendicularly from two opposite ends thereof. The mounting seat 42b has a configuration differing from mounting seat 42 described in the second embodiment in that two grooves (only one groove is visible in FIG. 3) receive the evaporating sections 241 of the two heat pipes 24 therein, respectively. The fins 53 are cooperatively provided with four through holes 235b (only two through holes 235b are visible in FIG. 3) receiving the condensing sections 242 of the heat pipes 24 therein. Each of the fins 53 includes a planar main body 532 perpendicular to the condenser sections 242 of the heat pipes 24, and two protruding members 531 protruding upwardly from a top surface of the main body 532 towards an adjacent upper main body 532. Each of the protruding members 531 defines a vent 533 therein. Each vent 533 communicates with two opposite sides of corresponding main body 532. Thus, when air between the fins 53 is heated by heat transferred from the light source 11 through the heat pipes 24, the warm air rises through the air exchanges 533 to a top side of the fins 53, and then through the air exchanges 341 of the mounting plate 34 into the electrical section 30, and finally to the exterior through the exhaust ports 322 of the electrical section 30.

Figure 4:
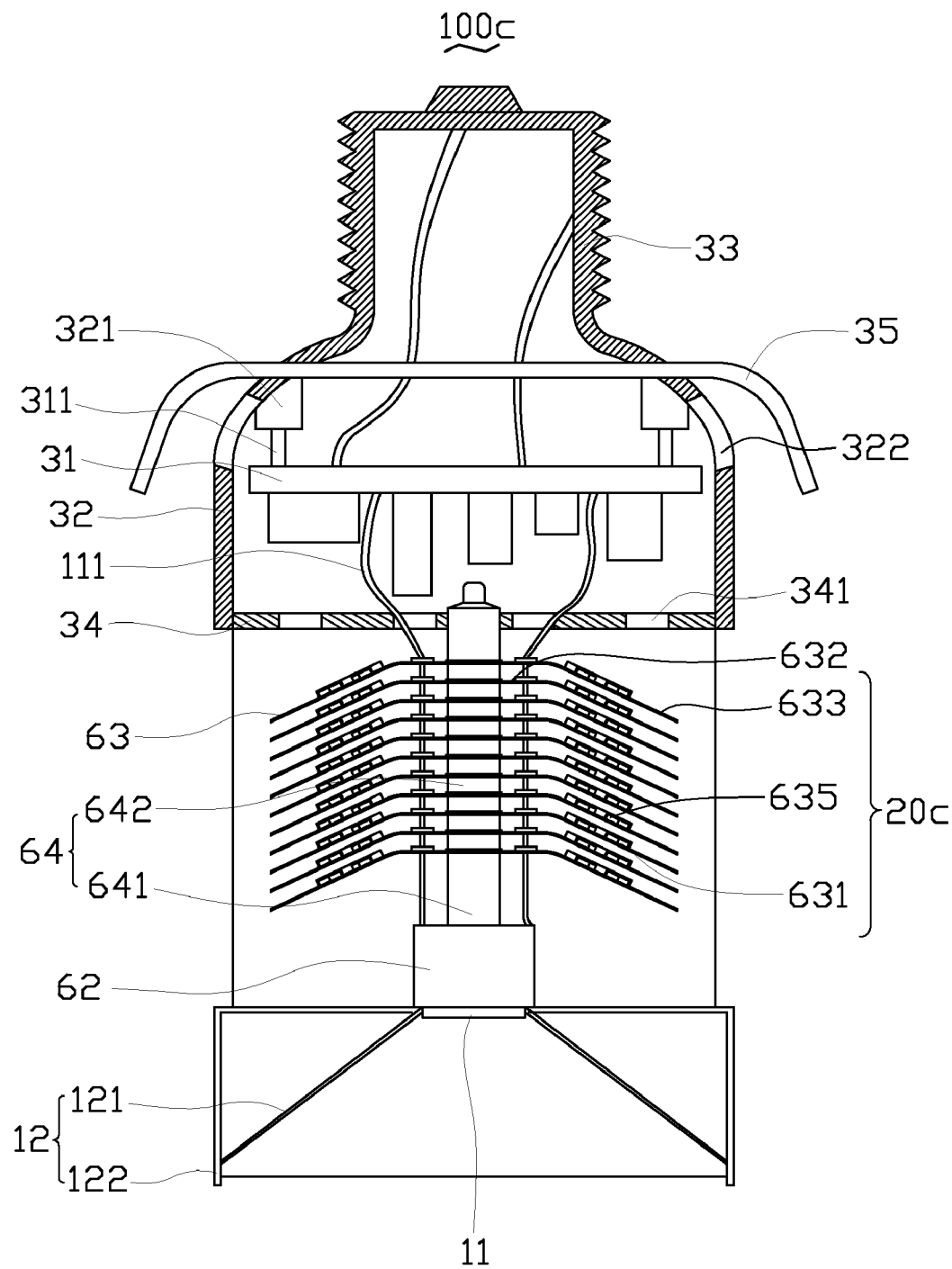
FIG. 4 is a cross-section of an LED illumination device in accordance with a fourth embodiment of the disclosure.

FIG. 4 is a cross-section of an LED illumination device 100c in accordance with a fourth embodiment of the disclosure, differing from the previous embodiment only in that a heat dissipation section 20c includes a mounting seat 62, a plurality of parallel, stacked fins 63 on the top surface thereof, and a straight heat pipe 64. The heat pipe 64 is columnar, and includes an evaporation section 641 and a condenser section 642 formed at bottom and top ends thereof, respectively. The bottom surface of the evaporation section 641 is planar, and thermally contacts the top surface of the mounting seat 62. The mounting seat 62 has a configuration differing from mounting seat 42 described in the second embodiment in that no groove is defined in the mounting seat 62 to receive the evaporating section 641 of the heat pipe 64. Alternatively, the mounting seat 62 can define a straight through hole receiving the evaporating section 641 of the heat pipe 64 therein, such that the bottom surface of the evaporating section 641 thermally contacts the light source 11 directly. Each of the fins 63 is umbrella-shaped and includes a planar main body 632 perpendicular to the condenser section 642 of the heat pipe 64 and two flanges 633 angling downwards from two opposite edges of the main body 632, respectively. The main body 632 of each fin 63 defines a central hole (not labeled) receiving the condenser section 642 of the heat pipe 64 therein. A protruding member 631 extends upwardly and perpendicularly from a top surface of each of the flanges 633 towards the air exchanges 341 of the electrical section 30. Each of the protruding members 631 defines a vent 635 therein. Each of the vents 635 communicates with two opposite sides of a corresponding fin 63 which defines the vent 635. Thus, when air between the fins 63 is heated by transferred heat of the light source 11, the warm air rises through the vents 635 to a top side of the fins 63, and then through the air exchanges 341 of the mounting plate 34 into the electrical section 30, and finally to the exterior through the exhaust ports 322 of the electrical section 30.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illumination device, comprising:
   an optical section disposed at a bottom end of the LED illumination device, in which a light source is provided;
   a heat dissipation section located adjacent to the optical section, comprising a plurality of fins thermally contacting the light source and a heat sink comprising a solid metal base, from which the fins extend radially and outwardly; and an electrical section disposed at a top end of the LED illumination device and electrically connecting to the light source, wherein the heat dissipation section is disposed between the optical section and the electrical section, the electrical section defines a plurality of air exchanges communicating the electrical section with the heat dissipation section and a plurality of exhaust ports communicating the electrical section with the external environment of the LED illumination device.

2. The LED illumination device of claim 1, wherein the metal base is provided with a blind hole extending vertically from an upper portion toward a lower portion of the metal base, an air venting channel is radially defined in the bottom portion of the metal base and communicates a bottom of the blind hole with an outside of the metal base, and spaces between each two neighboring fins and the blind hole communicate with the electrical section via the air exchanges.

3. The LED illumination device of claim 1, wherein the heat dissipation section further comprises a mounting seat to which the light source is attached and a heat pipe thermally connecting the mounting seat with the heat sink, the heat pipe comprising an evaporating section and at least one condensing section, the metal base defining at least one through hole receiving the at least one condensing section of the heat pipe therein, the evaporating portion being mounted to the mounting seat.

4. The LED illumination device of claim 3, wherein the mounting seat comprises a top mounting block thermally attached to the metal base and a bottom mounting block thermally attached to the light source, the evaporating portion of the heat pipe being sandwiched between the top mounting block and the bottom mounting block.

5. The LED illumination device of claim 1, wherein the heat dissipation section further comprises a mounting seat to which the light source is attached and a heat pipe thermally connecting the mounting seat with the fins, the heat pipe comprising an evaporating section and at least one condensing section, each of the fins comprising a main body perpendicular to the condensing section and defining a vent communicating two opposite sides of each of the fins.

6. The LED illumination device of claim 5, wherein each of the fins further comprises two flanges angling downwards from two opposite edges of the main body, respectively, the vent being defined in each of the flanges.

7. The LED illumination device of claim 1, wherein the electrical section comprises a casing and a mounting plate located on a bottom end of the casing, the mounting plate being arranged between the electrical section and the heat dissipation section, the air exchanges being defined in the mounting plate, the exhaust ports being defined in the casing.

8. The LED illumination device of claim 7, wherein the electrical section further comprises a lamp head located on a top end of the casing and a circuit board received in the casing, the circuit board comprising a plurality of electrical wires extending through the mounting plate and electrically connecting to the light source and a plurality of electrical wires electrically connected to the lamp head, providing operating power from an external power source via the lamp head to the light source.

9. The LED illumination device of claim 8, wherein the circuit board is mounted in the casing through a socket and attached to an inner surface of the casing and a connecting post connecting the circuit board with the socket.

10. The LED illumination device of claim 7, wherein the electrical section further comprises a dustproof cover covering an outer side the exhaust ports of the casing.

11. An LED illumination device, comprising:
an optical section disposed at a bottom end of the LED illumination device, a light source comprising at least one LED being provided in the optical section;
a heat dissipation section located adjacent to the optical section, comprising a plurality of fins thermally contacting the light source, and the heat dissipation section being provided with a heat sink comprising a solid metal base, the fins extending radially and outwardly from the metal base; and
an electrical section disposed at a top end of the LED illumination device and electrically connecting to the light source, wherein the heat dissipation section is disposed between the optical section and the electrical section, the electrical section comprises a mounting plate arranged between the electrical section and the heat dissipation section and a casing, the mounting plate defining a plurality of air exchanges communicating an internal of the electrical section with the heat dissipation section, the casing defining a plurality of exhaust ports communicating the internal of the electrical section with an external environment of the LED illumination device.

12. The LED illumination device of claim 11, wherein the metal base is provided with a blind hole extending vertically from a top portion toward a bottom portion of the metal base, spaces between each two neighboring fins and the blind hole communicating with the electrical section via the air exchanges.

13. An LED illumination device, comprising:
an optical section disposed at a bottom end of the LED illumination device, a light source comprising at least one LED being provided in the optical section;
a heat dissipation section located adjacent to the optical section, comprising a plurality of fins thermally contacting the light source, a mounting seat to which the light source is attached and a heat pipe thermally connecting the mounting seat with the fins, the heat pipe comprising a condenser section extending from a top end toward a bottom end of the heat dissipation section; and
an electrical section disposed at a top end of the LED illumination device and electrically connecting to the light source, wherein the heat dissipation section is disposed between the optical section and the electrical section, the electrical section comprises a mounting plate arranged between the electrical section and the heat dissipation section and a casing, the mounting plate defining a plurality of air exchanges communicating an internal of the electrical section with the heat dissipation section, the casing defining a plurality of exhaust ports communicating the internal of the electrical section with an external environment of the LED illumination device.

14. The LED illumination device of claim 13, wherein each of the fins comprises a main body perpendicular to the condenser section and defines a vent communicating two opposite sides of the each of the fins.

15. The LED illumination device of claim 13, wherein each of the fins comprises a main body perpendicular to the condenser section and two flanges angling downwards from two opposite edges of the main body respectively, each of the flanges defining a vent communicating two opposite sides of a corresponding fin.

* * * * *